United States Patent [19]

Ramer et al.

[11] Patent Number: 5,760,433
[45] Date of Patent: Jun. 2, 1998

[54] IN SITU REACTIVE LAYERS FOR PROTECTION OF FERROELECTRIC INTEGRATED CIRCUITS

[75] Inventors: O. Glenn Ramer; Robin W. Rosser, both of Los Angeles, Calif.

[73] Assignee: Hughes Electronics, Los Angeles, Calif.

[21] Appl. No.: 656,496

[22] Filed: May 31, 1996

[51] Int. Cl.⁶ .......................... H01L 29/76; H01L 27/108
[52] U.S. Cl. .......................... 257/295; 257/297; 257/506
[58] Field of Search ........................... 257/295, 297, 257/506

[56] References Cited

U.S. PATENT DOCUMENTS 4,149,301  4/1979  Cook ........................... 257/506
5,371,699  12/1994  Larson ........................... 257/295

Primary Examiner—Tom Thomas
Assistant Examiner—Fetsum Abraham
Attorney, Agent, or Firm—M. E. Lachman; M. W. Sales; W. K. Denson-Low

[57] ABSTRACT

A layer of sacrificial, chemically reactive material is formed as part of the fabrication process of an integrated circuit, and covers active circuitry to protect it from reaction with hydrogen. Integrated circuits and fabrication methods are provided by the present invention. The present invention is used to fabricate integrated circuits such as ferroelectric memories, and the like, using die or substrates containing one or more sacrificial layers of strontium bismuth niobate tantalate, for example. The sacrificial layers consume atmospheric hydrogen or other materials that otherwise would react with active circuitry of the integrated circuits and render them ineffective.

18 Claims, 3 Drawing Sheets

FIG. 3
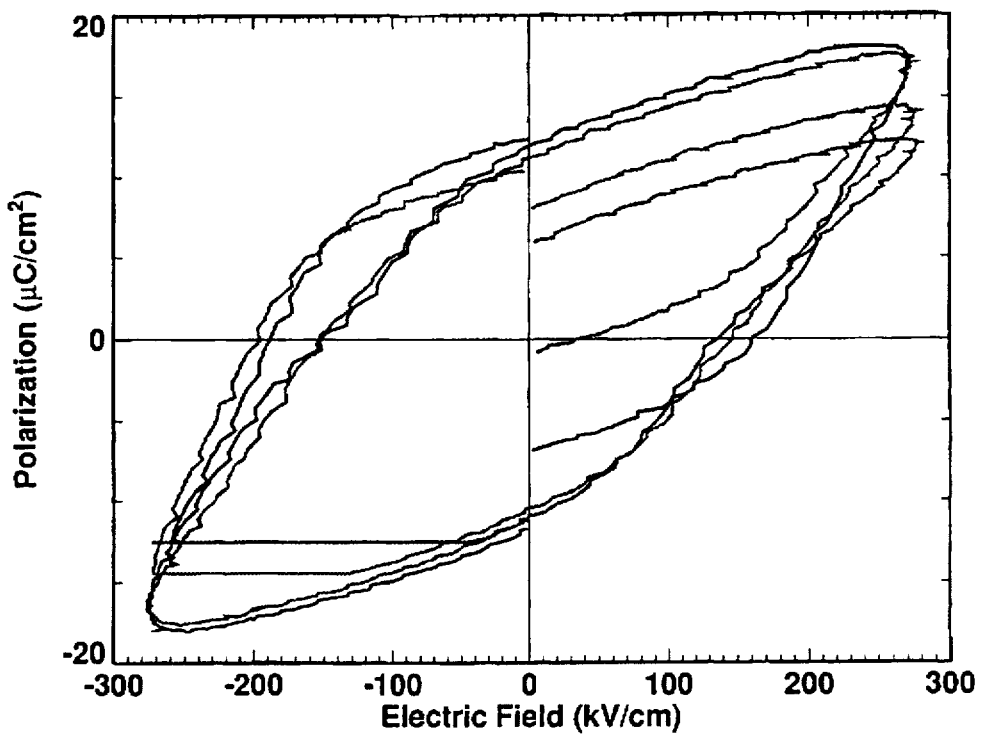
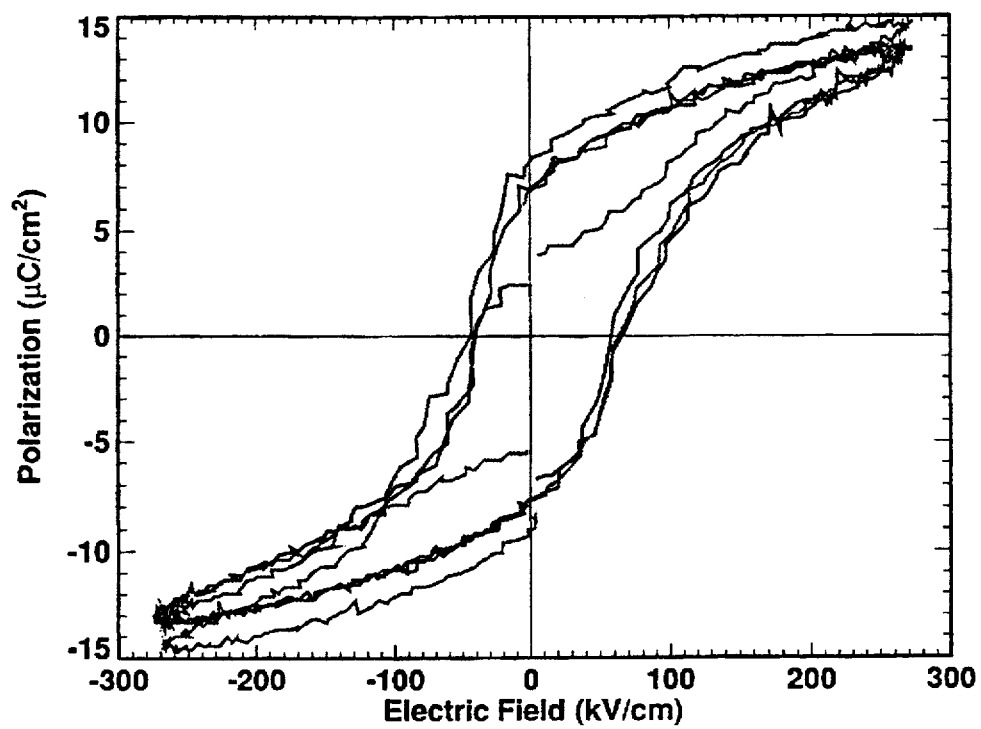
FIG. 4

FIG. 5
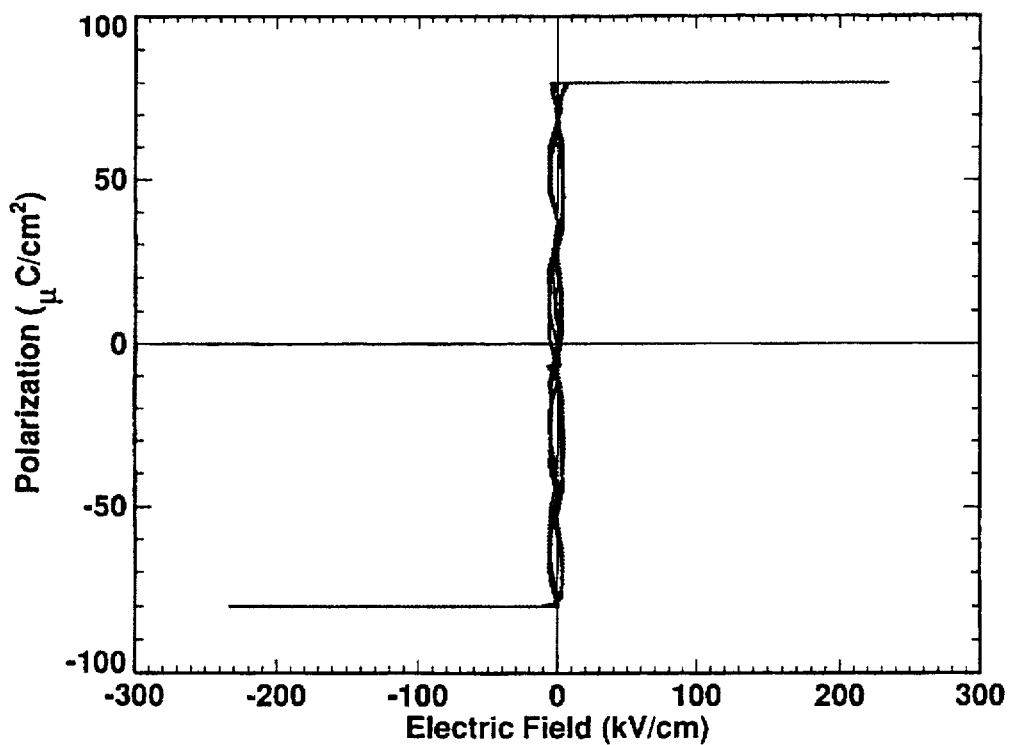
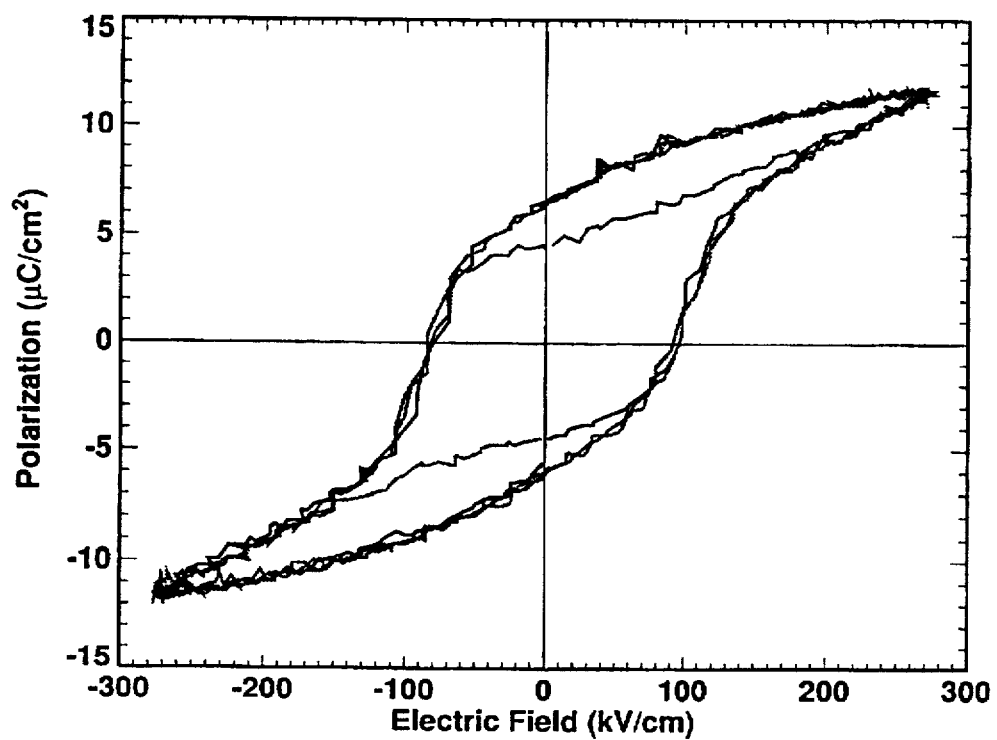
FIG. 6

IN SITU REACTIVE LAYERS FOR PROTECTION OF FERROELECTRIC INTEGRATED CIRCUITS

This invention was made with United States Government support under Contract No. N00030-95-C-0012 awarded by the Department of the Navy. The U.S. Government has certain rights in this invention.

BACKGROUND

The present invention relates generally to integrated circuits, and more particularly, to integrated circuits and fabrication methods that use in situ reactive layers to protect ferroelectric active circuits thereof.

The assignee of the present invention has developed ferroelectric memories for use in radiation hardened environments. The ferroelectric memories use a complex mixture of oxides as ferroelectric elements. One of the key constituents in the formulations is bismuth oxide. It has recently been discovered, however, that the bismuth oxide is attacked (chemically "reduced") by hydrogen in packaged devices. This renders the devices useless in a matter of hours. In the absence of hydrogen, the devices perform satisfactorily for years. The ferroelectric elements must therefore be protected from attack by hydrogen.

However, it is typically impractical to exclude all hydrogen from packaged devices. Hydrogen absorbed in the packaging material is outgassed during the packaging process itself, such as from the plating used to perform die attach and/or sealing. Hydrogen may also be produced by decomposition of organic materials present in the package, such as epoxy materials, and the like. Thus, while unpackaged devices last indefinitely in air (approximately 0.5 parts per million hydrogen), hydrogen in packaged ferroelectric devices has recently been shown to degrade the memories in a short period of time. The present invention addresses a solution to this problem.

In other technologies (prior art) where hydrogen has affected device performance, this sensitivity has been reduced by: (1) sealing the devices with silicon nitride or other similar material, (2) reducing the operating temperature of the device, (3) incorporating long bakes at elevated temperatures in vacuum prior to sealing the package, (4) selecting the package material to reduce the outgassing of hydrogen, and (5) incorporating a hydrogen getter into the package.

Since the amount of bismuth oxide in the developmental ferroelectric memory device is small, only small quantities of hydrogen are needed to destroy the devices. Therefore, attempts at reducing and not eliminating the hydrogen content or lowering the temperature simply prolongs the inevitable. The concept of placing a getter in the package requires a getter that removes all of the hydrogen, and it must react with the hydrogen before the bismuth oxide does. Many getter materials were developed for vacuum applications and do not work well in a nitrogen atmosphere typically used for hermetic packages. In addition, the getter reaction in most of these getters is not complete (i.e., an equilibrium of free and gettered hydrogen is established). Therefore, the getter approach is not particularly promising because it does not keep all of the hydrogen away from the sensitive components.

Overcoating the package using traditional passivation materials, such as silicon oxide and/or nitride, for example, is similarly not promising because these materials are not impermeable to hydrogen. In addition, processing environments required to deposit the passivation materials involve hydrogen that damage the ferroelectric. This damage can be reduced by high temperature (600°–800° C.) oxygen anneals.

Accordingly, it is an objective of the present invention to provide for integrated circuits and fabrication methods that use in situ reactive layers that protect active circuits from damage due to their chemical reaction with hydrogen.

SUMMARY OF THE INVENTION

To meet the above and other objectives, the present invention provides for the use of a layer (or overlayer) of sacrificial, chemically reactive material, that is formed as part of the fabrication process of the integrated circuit, and which covers active circuit components to protect them from reaction with hydrogen. The present invention comprises die containing one or more sacrificial layers of strontium bismuth tantalate niobate (SBTN) that allows the integrated circuit to survive an atmosphere containing a small concentration of hydrogen but otherwise suitable for long term (>20 year) use of the ferroelectric device, wherein a typical atmosphere is nitrogen. The purpose of the sacrificial layers is to consume any atmospheric hydrogen (or other material) which might otherwise react with active circuit components and render them ineffective.

The present invention has three unique features. The present invention incorporates a reactive layer directly in the integrated circuit (as opposed to in an external "getter"). The present invention covers the reactive components so that any potential reactant must transverse the layer to get to the component. In one embodiment, the reactive layer contains the same elements used in the active components, and therefore protects the components from any and all potentially adverse chemical reactions.

More specifically, the method of the present invention comprises fabricating active circuitry of an integrated circuit containing ferroelectric materials, and then covering the active circuitry of the integrated circuit with a sacrificial layer that comprises either (1) the same ferroelectric formulation used in the active circuitry, or (2) the active component contained in the ferroelectric formulation used in the active circuitry, namely bismuth oxide, or (3) other oxide that is easily reduced by hydrogen, such as PdO. Using the present invention, an adequate (by design) amount of bismuth oxide, for example, is available in the overlayer, and the bismuth oxide contained in the layer of strontium bismuth niobate tantalate is deposited between the source of hydrogen gas and the active circuitry. The hydrogen is consumed by the bismuth oxide before it migrates to the active circuitry and adversely affects it.

The integrated circuit fabricated by the present method comprises a substrate and active circuitry fabricated on the substrate that contains ferroelectric materials. A sacrificial layer covers the active circuitry that comprises a material that reacts with and is consumed by hydrogen and which prevents the hydrogen from reacting with the ferroelectric materials contained in the active circuitry.

The present invention protects the reactive components better than a traditional cover layer such as $SiO_2$, because the latter will transmit reactive species such as hydrogen either by diffusion or by migration through cracks. The present invention consumes the reactive species as they migrate. The present invention protects the reactive components better than a traditional getter installed in the electronic package, because the latter is more remote from the reactive component. In the traditional getter approach the potential exists for reactive contaminants to get to the components without first reacting with the getter. The present invention protects the reactive components better than an organic encapsulant, because such materials transmit hydrogen by way of diffusion. Furthermore, hermetic sealing will not solve the problem, because processes for creating such seals generally create and trap hydrogen.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIGS. 3–6 show graphs illustrating the performance of the integrated circuit of FIG. 1.

DETAILED DESCRIPTION

Figure 1:
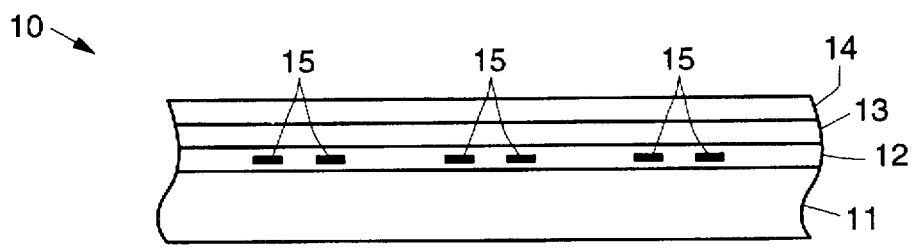
FIG. 1 shows an integrated circuit in accordance with the principles of the present invention.

Referring to the drawing figures, FIG. 1 shows an integrated circuit 10 in accordance with the principles of the present invention. The integrated circuit 10 comprises a substrate 11 and an active layer 12 fabricated on the substrate 11 that contain active circuitry 15 that is made of ferroelectric materials. A sacrificial layer 13 covers the active layer 12 and active circuitry 15 that comprises a material that reacts with and is consumed by hydrogen and which prevents the hydrogen from reacting with the ferroelectric materials contained in the active circuitry 15. A passivation or sealing layer 14 may be deposited over the sacrificial layer 13 to seal the integrated circuit 10.

Figure 2:
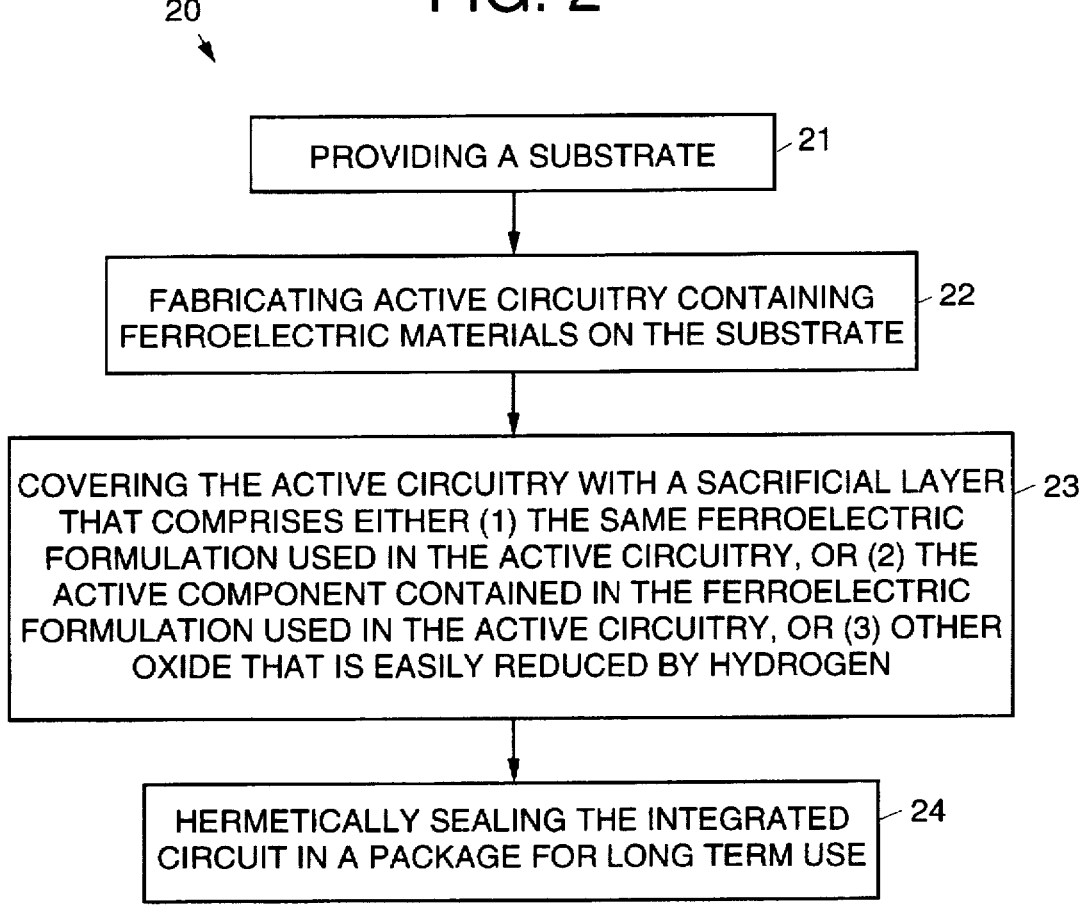
FIG. 2 shows a flow diagram illustrating one method in accordance with the principles of the present invention for fabricating the integrated circuit of FIG. 1.

FIG. 2 shows a flow diagram illustrating one method 20 in accordance with the principles of the present invention for fabricating the integrated circuit 10 of FIG. 1. The present method 20 fabricates the integrated circuit 10 in a manner that protects the active components, or active circuitry 15, that contain ferroelectric material from attack by hydrogen.

The present method 20 comprises the following steps. A substrate 11 is provided 21. Active circuitry 15 containing ferroelectric materials of an integrated circuit 10 are fabricated 22. The active circuitry 15 is then covered 23 with a sacrificial layer 13 that comprises either (1) the same ferroelectric formulation used in the active circuitry 15, or (2) the active component contained in the ferroelectric formulation used in the active circuitry 15, or (3) other metal oxides such as PdO that is easily reduced by hydrogen to form metal and water. The integrated circuit 10 is typically hermetically sealed 24 in a package containing an atmosphere (such as nitrogen with contaminants such as hydrogen, water and organics) for long term (>20 years) use.

Using the present invention, an adequate (by design) amount of bismuth oxide is available in the overlayer to consume the contaminant hydrogen from the package, and the bismuth oxide is deposited between the source of hydrogen gas and the active circuitry. The hydrogen is consumed by the bismuth oxide before it migrates to the active circuitry and adversely affects it.

Wafers with an overlayer made in accordance with the principles of the present invention have been fabricated and successfully tested. It has been found that hydrogen sensitive layers and active circuitry 15 of the integrated circuit 10 demonstrate extended operating lifetimes in the presence of a constant source of hydrogen. These wafers were made and tested as follows.

Layers of strontium bismuth tantalate niobate (SBTN) were applied to the top of two identical wafers containing hydrogen-sensitive SBTN capacitors. The first wafer was patterned with a via mask that allowed contact to metal pads for measurement. This left a sacrificial SBTN layer over the majority of the top surface of the first wafer. The second wafer was patterned with a mask that removed the SBTN layer from the top surface except over the capacitors. The layers were approximately 2000 Angstroms thick and were applied as two layers that were approximately 1000 Angstrom thick. The layers were deposited by spin-on deposition or coating. Each layer was fabricated using the process for fabrication of the capacitors, which included hot plate baking and rapid thermal annealing of the wafers. The stack of two layers was annealed for one hour at 800 degrees Celsius in oxygen after patterning.

Capacitors without the sacrificial layer were used as control elements. Two strontium bismuth tantalate (SBT) and two SBTN capacitor die were used as control elements. The two SBTN die had a similar construction as the wafers described above.

In an experiment to prove out the principles of the present invention, the control elements and the die from the above two wafers were placed into flowing nitrogen gas containing 1000 parts per million of hydrogen at 125 degrees Celsius to simulate a package environment (except that the hydrogen was not consumed). Periodically the die were removed and measured at room temperature. The reaction of the hydrogen with the sacrificial layer depletes the hydrogen in the package environment. In the experiment, however, the hydrogen was constantly replenished because the nitrogen and hydrogen mixture was continually refreshed. In the experiment, failure was eventually guaranteed. However, in a package, the hydrogen would be consumed, and the thickness of the sacrificial layer would be chosen to provide adequate consumption of the hydrogen during the lifetime of the package.

Measurements were made using a hysteresis loop and are shown in FIGS. 3–6. FIG. 3 shows a graph of polarization versus electric field for SBTN control die after 8 hours of immersion in the flowing nitrogen gas. FIGS. 4 and 5 show graphs of polarization versus electric field for SBT control die after 28 hours of immersion in the flowing nitrogen gas. FIG. 6 shows a graph of polarization versus electric field for SBTN die having a sacrificial layer made in accordance with the principles of the present invention after 100 hours of immersion in the flowing nitrogen gas.

After 8 hours the control elements comprising the SBTN samples were degraded to the point of uselessness. After 28 hours, the control SBT samples were degraded to the point of uselessness. After 100 hours, the SBTN samples containing the sacrificial overlayer of the present invention were somewhat degraded but were ferroelectric and operative.

Thus, integrated circuits and fabrication methods that use in situ reactive layers that protect active circuits from damage due to their chemical reaction with hydrogen have been disclosed. It is to be understood that the described embodiments are merely illustrative of some of the many specific embodiments which represent applications of the principles of the present invention. Clearly, numerous and varied other arrangements may be readily devised by those skilled in the art without departing from the scope of the invention.

What is claimed is:

1. A method of protecting an integrated circuit containing ferroelectric materials from reaction with hydrogen, said method comprising the steps of:

providing a substrate;

fabricating active circuitry on the substrate wherein the active circuitry contains ferroelectric materials;

covering the active circuitry with a sacrificial continuous layer of material that reacts with and is consumed by hydrogen whereby the hydrogen is prevented from reacting with the ferroelectric materials of the active circuitry.

2. The method of claim 1 wherein the sacrificial layer comprises a ferroelectric formulation used to fabricate the active circuitry.

3. The method of claim 2 wherein the sacrificial layer comprises strontium bismuth niobate tantalate.

4. The method of claim 1 wherein the sacrificial layer comprises an active component contained in the ferroelectric formulation used in the active circuitry.

5. The method of claim 4 wherein the sacrificial layer comprises bismuth oxide.

6. The method of claim 1 wherein the integrated circuit comprises a ferroelectric memory.

7. The method of claim 1 wherein the sacrificial layer comprises a metal oxide that is easily reduced by hydrogen.

8. The method of claim 7 wherein the sacrificial layer comprises PdO.

9. The method of claim 1 wherein the integrated circuit is fabricated and hermetically sealed in a package for long term use.

10. The method of claim 9 wherein the package contains nitrogen with contaminant amounts of hydrogen.

11. An integrated circuit comprising:

a substrate;

active circuitry fabricated on the substrate wherein the active circuitry contains ferroelectric materials;

a sacrificial layer covering the active circuitry that comprises a continuous layer of material that reacts with and is consumed by hydrogen and which prevents the hydrogen from reacting with the ferroelectric materials contained in the active circuitry.

12. The integrated circuit of claim 11 wherein the sacrificial layer comprises a ferroelectric formulation used to fabricate the active circuitry.

13. The integrated circuit of claim 12 wherein the sacrificial layer comprises bismuth oxide.

14. The integrated circuit of claim 11 wherein the sacrificial layer comprises an active component contained in the ferroelectric formulation used in the active circuitry.

15. The integrated circuit of claim 14 wherein the sacrificial layer comprises strontium bismuth niobate tantalate.

16. The integrated circuit of claim 11 wherein the active circuitry comprises a ferroelectric memory.

17. The integrated circuit of claim 11 wherein the sacrificial layer comprises a metal oxide that is easily reduced by hydrogen.

18. The integrated circuit of claim 17 wherein the sacrificial layer comprises PdO.

* * * * *